(12) United States Patent
Nagaswami et al.

(10) Patent No.: US 6,242,270 B1
(45) Date of Patent: Jun. 5, 2001

(54) METHOD OF MANUFACTURING INTEGRATED CIRCUITS

(75) Inventors: Venkat R. Nagaswami; Johannes G. Van Gessel; Dries A. Van Wezep, all of Nijmegen (NL)

(73) Assignee: U.S. Phillips Corporation, New York, NY (US)

( * ) Notice: Subject to any disclaimer, the term of this patent is extended or adjusted under 35 U.S.C. 154(b) by 0 days.

(21) Appl. No.: 09/247,783

(22) Filed: Feb. 9, 1999

(30) Foreign Application Priority Data

Feb. 10, 1998 (EP) .................................................. 98200413

(51) Int. Cl.[7] .................................................. H01L 21/66
(52) U.S. Cl. ........................... 438/14; 356/237; 382/145; 364/468
(58) Field of Search ............................... 438/14; 382/145; 356/237.4; 364/468

(56) References Cited

U.S. PATENT DOCUMENTS

| | | | | |
|---|---|---|---|---|
| 4,144,493 | * | 3/1979 | Lee et al. ........................ | 324/158 R |
| 5,537,325 | * | 7/1996 | Iwakiri et al. ................... | 364/468.28 |
| 5,544,256 | * | 8/1996 | Brecher et al. ................... | 382/149 |
| 5,726,920 | * | 3/1998 | Chen et al. ...................... | 364/579 |
| 5,787,190 | * | 7/1998 | Peng et al. ....................... | 382/145 |
| 5,801,965 | * | 9/1998 | Takagi et al. ..................... | 364/552 |
| 5,862,055 | * | 1/1999 | Chen et al. ...................... | 364/468 |
| 6,021,380 | * | 2/2000 | Fredriksen et al. ................ | 702/35 |
| 6,035,430 | * | 3/2000 | Taniguchi ......................... | 714/724 |
| 6,072,574 | * | 6/2000 | Zeimantz ......................... | 356/237 |
| 6,084,420 | * | 7/2000 | Chee ............................... | 324/754 |
| 6,091,846 | * | 7/2000 | Lin et al. ......................... | 382/145 |

FOREIGN PATENT DOCUMENTS 5259015  10/1993 (JP) .

* cited by examiner

*Primary Examiner*—Jey Tsai
*Assistant Examiner*—Olivia Luk
(74) *Attorney, Agent, or Firm*—Steven R. Biren

(57) ABSTRACT

Visible defects are detected on a process semiconductor wafer. Defects are classified according to appearance and an association is kept between classes and apparatuses. When the density of defects in a given class exceeds a control limit the associated apparatus is switched off-line. In an embodiment, the same wafer is inspected repeatedly, each time after a different processing steps and information about the location of detected defects is kept. Defects which occur at a location where defects have already been detected in a previous inspection after an earlier processing step are eliminated from the density which is compared to the control limit.

7 Claims, 3 Drawing Sheets

METHOD OF MANUFACTURING INTEGRATED CIRCUITS

BACKGROUND OF THE INVENTION

The invention relates to a method of manufacturing integrated circuits as described in the precharacterizing part of claim 1. The invention also relates to a system implementing said method.

Such a method is known from the abstract of Japanese patent application laid open number 5-259015 (1993).

Integrated circuits are manufactured by submitting wafers to a series of processing steps. During processing defects may occur on the wafer, which reduce the yield of properly functioning integrating circuits on the wafer. Malfunctioning apparatuses may increase the number of defects. The abstract of Japanese patent application laid open number 5-259015 (1993) proposes to count the number of defects such as particles or patterning errors on the wafer after a processing step. If the number of defects is to high, it is attempted to redo the processing step in order to remove the defects. If this is not possible, the wafer is discarded and the process conditions are adjusted before processing further wafers.

Such a method may be used in factory management system to increase the yield and to control the correction of malfunctioning apparatuses. However, if such a method is applied at each processing step to check for malfunctioning of the apparatus performing that processing step, the factory management system would become very expensive, even if it were possible without disturbing the processing steps. Moreover, in general there is no certainty that defects detected after a processing step are actually due to the apparatus performing that processing step: the defects might be due to apparatuses that perform earlier processing steps.

SUMMARY OF THE INVENTION

Amongst others, it is an object of the invention to provide for a method of manufacturing integrated circuits in which processing apparatuses that do not perform satisfactorily are detected without the need to detect defects at every processing step.

The method of manufacturing integrated circuits according to the invention is characterized by the characterizing part of claim 1. Herein "apparatuses" generally refer to devices that have an individual effect on integrated circuit wafers at some stage; as used herein, an apparatus may be a component of a system containing several such components. "processing steps" refer generally to tasks performed by the apparatuses.

Examples of different classes of defects that can be distinguished are scratches, particle contamination, lattice stacking faults, dripped liquid, focus errors, pinholes in patterns, bridges between patterns, poorly developed patterns, deviating linewidths, presence of flakes, Tungsten particles, Ti/TiN particles, Blocked etch, corrosion, missing contacts etc.

By counting defects of different classes separately after a number of processing steps, and by providing associations that automatically links different classes of defects to processing steps, it is possible to detect apparatuses that are suspected of not performing satisfactorily automatically and without exhaustive testing. When an apparatus is brought off-line, this is signalled to a process operator, who will adjust or repair the apparatus before bringing it on-line again.

Often several equivalent apparatuses are available performing at least one of the processing steps from a set of apparatuses capable of performing that at least one of the processing steps. In that case, one will keeping a record indicating which apparatus has performed the at least one of the processing steps on the wafer and select the apparatus that is brought off-line using said record when the at least one of the processing steps is associated with the particular class, the apparatus that is brought off-line being removed from said set, so that it will no longer be selected for performing the at least one processing step, at least until an adjustment has been made. Thus, the excess number of defects can be linked to a specific apparatus.

Another embodiment of the method according to the invention is described in claim 2. This embodiment provides for using a differential count, representing the increase in the number of defects due to a number of processing steps between defect counting at a first stage and defect counting at a second stage. The differential count is much more sensitive to defects caused by apparatuses performing processing steps between the second and first stage, and therefore apparatuses can be switched off-line more reliably.

A further embodiment of the method according to the invention is described in claim 3. By using a fraction of the defects detected at the second stage a reasonable estimate of the number of prior defects can be realized without serious intervention in the process.

Another embodiment of the method according to the invention is described in claim 4. Instead of counting defects individually, all defects in a cluster counted as one defect only. This prevents unnecessary switch-off due to a complicated local defect that hardly affects overall yield. If clusters are only a small fraction of the defects, one may even omit the defects in a cluster from the count entirely.

Another embodiment of the method according to the invention is described in claim 5. Basically, only the defect density, i.e. the number of defects per unit of area on the wafer needs to be known in order to decide about switching apparatuses off-line. By counting defects on part of the wafer only, the amount of time needed for counting may be reduced.

Another embodiment of the method according to the invention is described in claim 6. According to this embodiment visual defects are first detected irrespective of their class, from abnormalities in the wafers, which are detected for example by comparing image locations of one chip on the wafer with corresponding image locations for a neighboring chip, or of a known "good" chip. Subsequently, the defects that have been found are classified. The defects may be clustered before they are classified, to reduce the time needed for classification. In principle only a fraction of randomly selected abnormalities needs to be classified, if one uses the assumption that the total number of defects of each class is proportional to the total number of classified abnormalities divided by the fraction.

BRIEF DESCRIPTION OF THE DRAWINGS

These and other advantageous aspects of the invention will be described in a non-limitative way using the attached figures of which FIG. 1 shows an illustrative example of an automated integrated circuit manufacturing system. The system comprises a central computer 10, with memory units 101, 102, handling stations 14a–i and a network 12 connecting the central computer 10 to the handling station 14a–i. Batches of wafers 16a–n waiting to be processed at the handling stations 14a–i are shown symbolically. A transport system 18 is shown for transporting batches 16a–n between handling stations 14a–i.

In operation the integrated circuit manufacturing system ensures that wafers undergo a series of processing steps to manufacture a desired integrated circuit.

Figure 2:
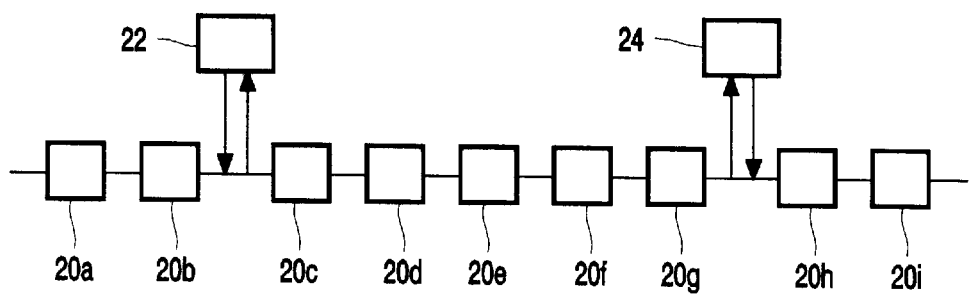
FIG. 2 shows a flow chart of an integrated circuit manufacturing process

FIG. 2 shows an example of part of a flow chart of an integrated circuit manufacturing process. The flow-chart contains a number of processing steps 20a–i which performed sequentially upon the wafer. Examples of processing steps include deposition of photo-resist, exposure of the resist using a photo-mask, resist developing, etching, implantation, material deposition from liquids, vapors, gasses and many others. The flow-chart also shows two visual inspection steps 22, 24, to be executed between different processing steps.

Figure 1:
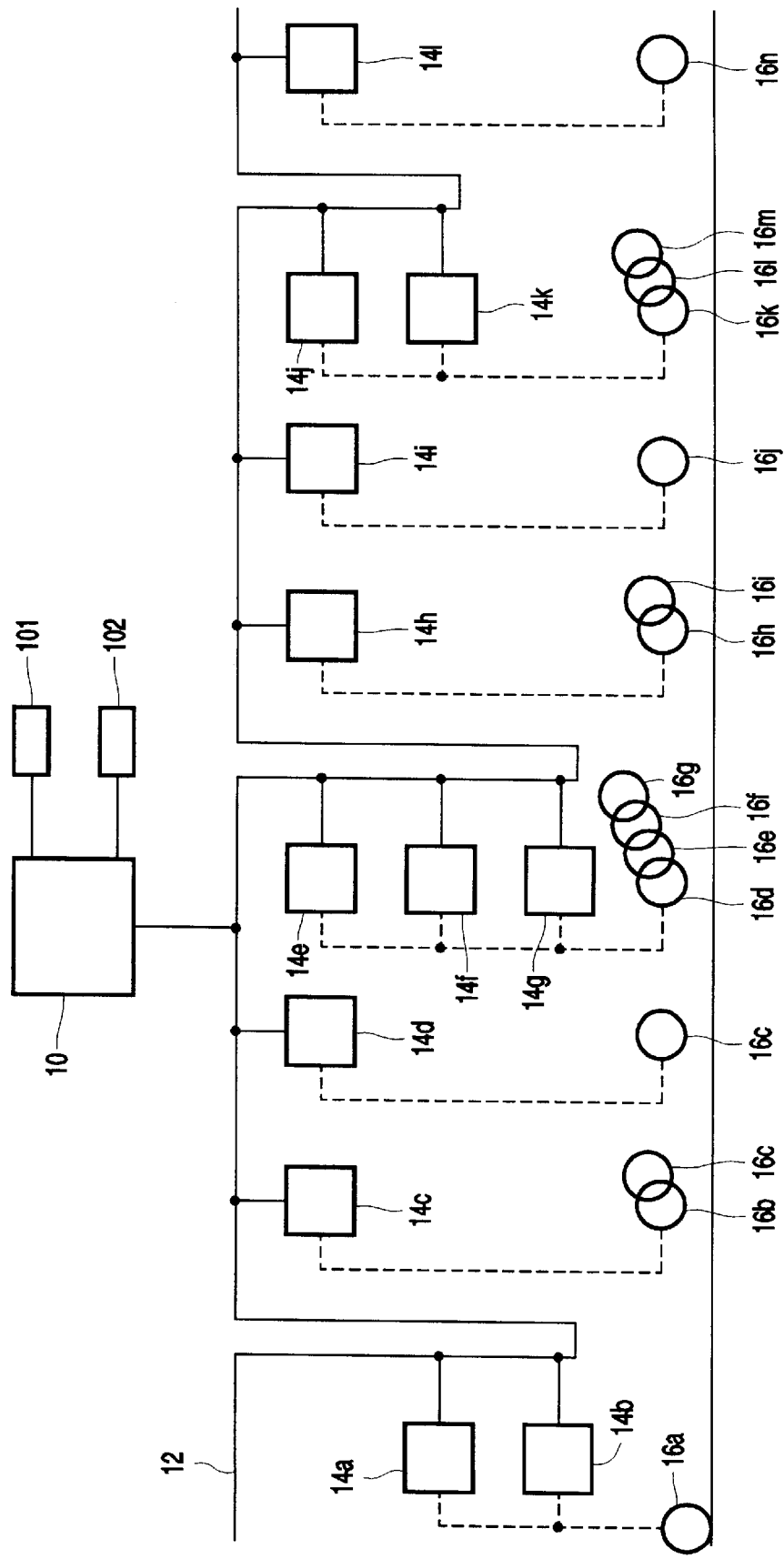
FIG. 1 shows an automated integrated circuit manufacturing system

Different processing steps are generally executed by different handling stations 14a-i, which contain apparatuses for performing specific types of processing steps. Such apparatuses include for example wafer steppers, etchers, developers, implantation apparatuses, deposition equipment and many others. Dependent on the type of apparatus, their may be one or more equivalent apparatuses available to perform the same processing step. FIG. 1 illustrates this by showing different handling stations 14a–i for equivalent apparatuses vertically below one another.

Each wafer or batch of wafers 16a-n has an identity which is represented in the central computer 10. The central computer 10 stores information about the process flow-chart that a wafer or batch of wafers 16a–n should undergo. This information defines the processing steps 20a–i that have to be performed and their sequence. The central computer also records which processing steps 20a–i have already been performed on a wafer or batch of wafers 16a–n and determines what next processing step 20a–i should be performed on a wafer or a batch of wafers 16a–n. The central computer 10 sends signals via the network 12 to the handling stations 14a–i or the transport system in order to ensure that the batches or wafers are transported to a handling station 14a–i capable of performing that next processing step 20a–i. The transport may be effected by the transport system 18 or by a human operator.

When a wafer of batch of wafers 16a–n is to be processed at a handling station 14a–i, the identity of the wafers or the batch 16a–n is signalled by the handling station 14a–i to the central computer 10. The central computer checks whether the flow-chart prescribes that the identified wafer or batch 16a–n should undergo next the particular processing step for which the handling station 14a–i is used. If this is not so the central computer 10 sends an error signal to the handling station 14a–i in order to prevent processing of that wafer or batch 16a–n at that handling station 14a–i. The handling station 14a–i responds to this signal for example by refusing to load the wafer or batch 16a–n or by displaying an error report to a human operator which signalled the intent to process the wafer o batch 16a–n at the handling station 14a–i. After processing, the central computer 10 indicates the next handling station 14a–i or group of equivalent handling stations 14a–i to which the wafer or batch 16a–n should be transported.

Several types of defect detection systems can be used for detecting defects. For example, visual inspection stations are provided for performing visual inspection steps 22, 24 of wafers once they have undergone a number of processing steps 20a–i. The defects detected are applied to control the use of the handling stations 14a–i. For this purpose one defines a number of classes of defects, with different types of visual appearance. Examples of classes are scratches, presence of contaminating particles, lattice stacking faults, dripped liquid, focus errors, pinholes in patterns, bridges between patterns, poorly developed patterns, deviating linewidths, presence of flakes, Tungsten particles, Ti/TiN particles, blocked etch, signs of corrosion, missing contacts etc. The defects may be classified by a person or automatically, e.g. using a visual pattern recognition system.

Figure 3A:
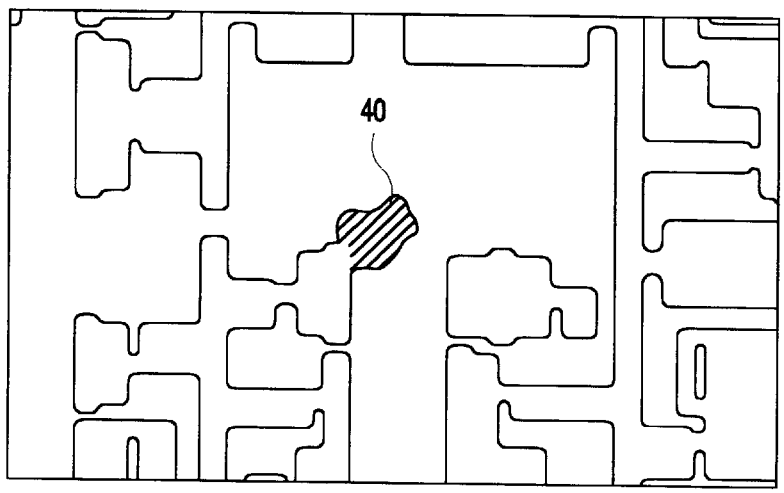
FIGS. 3a–b show examples of defects from different defect classes
Figure 3B:
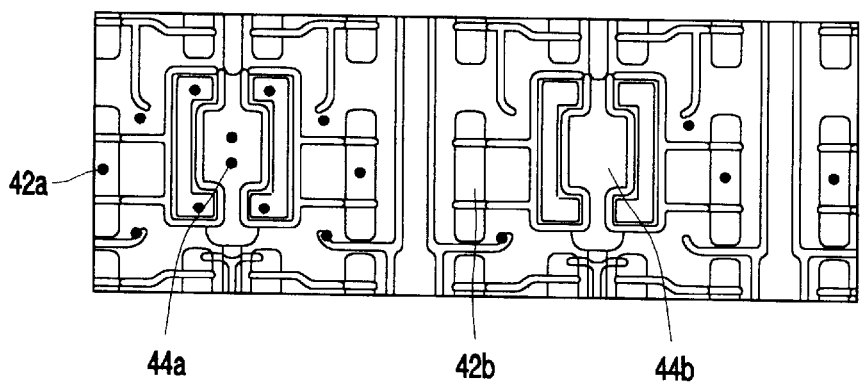

FIGS. 3a–b show examples of defects from different classes. FIG. 3a shows an image of an integrated circuit which contains an image feature 30 which is not normally present in images of the integrated circuit. The image feature 30 is assigned to a class of defects containing features that are characterized by features having irregular shape with sharp corners. This class is associated with etchers (and is labelled blocked etch defect). When the density of defects from this class exceeds its control limit the etcher which produces the relevant layer is switched off-line.

FIG. 3b shows an image of an integrated circuit in which contacts (visible as dots) 32a, 34a are missing at locations 32b, 34b on the right side of the image, where they should occur in normal circuits. Such an image is classified into a class of defects which are characterized by missing contacts. This class is associated for example with an oxide etcher. When the density of defects from this class exceeds its control limit, the oxide etcher which was used to process the integrated circuit is switched off-line.

More generally, one associates each class with one or more apparatus types used in specific processing steps 20a–i. When a class is associated with a processing step this implies that the apparatus used in the associated processing step 20a–i may cause defects in that class when the apparatus performing the processing step 20a–i does not function properly. Examples of associations are scratches—all apparatuses in all steps presence of many different types of particles—all apparatuses in all steps repeating defect—reticle in exposure step poor focus—lithographic exposure system in lithography steps pinhole defect—apparatus used in application of resist step bridging defect—apparatus used in application of resist step poor development—apparatus used in developing step deviating linewidth—apparatus used in litho steps presence of flakes—etching, CVD (Chemical vapor deposition) SOG blocked etch—etchers, Litho equipment corrosion—etching, resist stripping polymer flakes—polymer forming etch equipment The count of the number of defects is applied to control the use of apparatuses. This function is performed for example by the central computer 10. For this purpose, the central computer 10 keeps information about the association e.g. in the form of a database with relations R1=(defect class, processing step, apparatus type) in memory 101. The central computer also keeps information about the apparatuses used to perform processing steps on each wafer or batch 16a–n, e.g. in the form of a database with relations R2=(wafer, processing step, apparatus) in memory 102. Furthermore, for each class a control limit is defined indicating a number of defects in that defect class that is acceptable at the stage in the process where the defects are detected.

Figure 4:
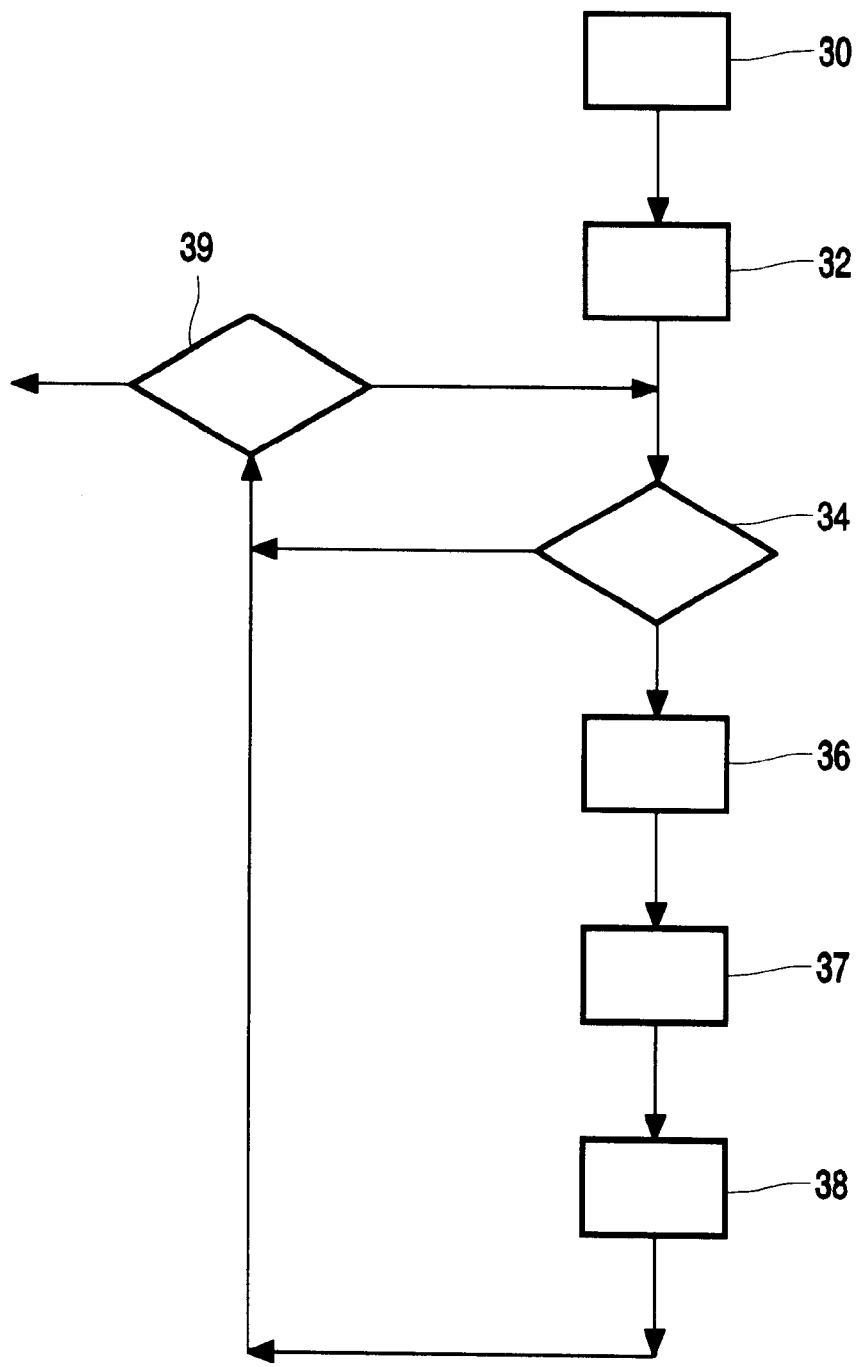
FIG. 4 shows a flow chart of a method according to the invention

FIG. 4 shows a flow-chart for controlling use of the handling stations 14a–i by means of the detected defects. In a first step 30, defects are detected visually and there position is noted. In a second step 32, the detected defects are classified into classes of defects types with different visual appearance. A count is kept of the number of defects in each class. The subsequent steps 34, 36, 37, 38, 39 are performed for each of the classes. For this purpose, an actual class is initialized to an initial class in the second step 32.

In a third step 34 the count of the number of defects in the actual class is compared to a control limit defined for that class. If the number of defects in the class exceeds the control limit, a fourth step 36 is executed, which determines the processing steps 20a–i that are associated with the actual class. In a fifth step 37 it is determined which apparatuses performed those processing steps on the inspected wafer and are of the type associated with the defect class. These apparatuses are then switched off-line in a sixth step 38. In a seventh step 39 it is determined whether all classes have been considered. This step is also entered from the third step if the count of defects of the actual class is below the control limit. If there remain classes that have not been considered, the flow-chart is repeated from the third step for one of the remaining classes.

When apparatuses are switched off-line, they will no longer be used for performing processing steps 20a–i. This is effected for example reporting an off-line status at the handling station 14a–i for that apparatus, or reporting an error when an operator attempts to load a new wafer or batch 16a–n at the handling station, or by disabling performance of the loading operation at the handling station 14a–h. as a result, subsequent batches will have to be handled at other, equivalent handling stations 14a–h, or they will have to wait until the apparatus is on line again.

The fact that an apparatus is taken off-line is reported to enable an operator to check, and readjust, repair or replace the apparatus. When this has been done, the apparatus will be put on-line once more and normal processing at the corresponding handling station 14a–i may be resumed.

According to the invention the visual inspection is used to measure the performance of the processing apparatuses included in the handling stations 14a–i, not to detect all individual faulty chips. Therefore, it is sufficient to take samples instead of inspecting all wafers or all defects. For example, one might inspect only a fraction of the wafers, or only part of the area on the wafers that are inspected. Similarly, one might classify only a sample of all defects. All such sampled inspection can be converted into estimated defect densities per unit area on all wafers.

In one embodiment, during visual inspection defects on the wafers are detected and classified into different classes in two steps. This may be realized for example by comparing the image of one chip on the wafer with another chip on the wafer. If the difference is too great at a certain location on a chip, a defect and the corresponding position are reported. The locations for which defects are reported are subsequently analyzed in more detail to classify the defect. The classification may be realized by showing an image of an area of the chip surrounding the location to a human operator, and receiving from the human operator a classification code of the class recognized by the human operator. Alternatively, automatic visual classification equipment may be used.

In an embodiment, one does not count individual defect locations, but only clusters of spatially close defect locations. Thus it can be prevented that apparatuses are switched of due do a few local defects with many defect locations.

Visual inspection steps may take place at more than one different stage during processing. In FIG. 2, for example, visual inspection takes place at a stage between steps 20b and 20c and at a later stage between steps 20f and 20g. As a rule, the processing steps that are associated with different defect classes will depend on the stage at which the visual inspection takes place. Usually, only a number of the last preceding steps 20a–i before the stage of the visual inspection step 22, 24 will be associated with any defect class, but no earlier processing steps 20a–i. The central computer may implement this for example by keeping a data base with relations R1a=(stage, defect class, processing step) R3= (stage, defect class, control limit) and switching only those apparatuses off-line that are associated with the defect classes for the stage at which the inspection takes place when the count of defects in the class exceeds the control limit for that class defined for that stage.

Sometimes, defects from distant earlier processing steps 20a–i will still be visible at a stage where an inspection step 22, 24 takes place. This may affect the reliability with which the count of the number of defects in a class may be used to take apparatuses off-line. To reduce this problem, one may discount defects that have been caused by such distant earlier processing steps.

A preferred way of doing this is to keep a record of the locations on a wafer at which defects have been detected at an earlier stage and to count defects on that wafer at a later stage only if those defects are not located at or near locations where defects have been detected at an earlier stage (or at least where defects in related classes have been detected at the earlier stage; a first and second class are said to be related if it is known that defects from the first class after a first step often precede defects from the second class after a later step). So for example, if at the earlier stage defects of a class C1 have been detected at locations (R1, . . . ) and defects of a class C2 have been detected at locations (R2, . . . ), and subsequently defects of class C are detected at a number of locations (R0, R1, R2, Ra, Rb), these locations are compared with the locations of the defects of the related classes C1, C2 at the earlier stage and only those defects are counted which occur at locations (R0, Ra, Rb) at which no related defects have been detected at the earlier stage. Under some circumstances it may be exclude only a fraction of the defects at locations where earlier defects have been detects. Such a fraction then accounts for the probability that the earlier defect causes the detection of the later defect at the same location.

However, this requires performing inspection on the same wafer and keeping information about defect locations. Another way of discounting defects that have been caused by distant earlier processing steps is to use the count of defects in different classes detected at an earlier stage as a prediction of the count of defects in different classes that will be visible at the later stage. This prediction may for example be a linear prediction:

$$\text{pred}(N_{bi}) = c \, N_{ai}$$

Here Nai is the counts of defects in the ith class at stage "a" and pred(Nbi) is the prediction of the count Nbi of defects in the ith class at a later stage "b". Counts Nbi for the same wafer, or for a wafer from the same batch or lot may be used. "c" is a factor selected to give a good prediction. Of course, the prediction may also be a linear combination of counts of different classes, or even of counts at different stages. The factor "c" or factors may be determined for example from inspection statistics obtained when the apparatuses function properly.

Such a prediction is then subtracted from the actual count of defects in these classes at the later stage:

$$DNbi=Nbi-pred(Nbi)$$

The result DNbi is compared to the control limit defined for the later stage and if the result DNbi exceeds the control limit an apparatus or apparatuses are switched off-line.

What is claimed is:

1. A method of manufacturing integrated circuits, the method comprising the steps of:

processing a wafer with an apparatus;

counting a number of visible defects on the wafer after processing with said apparatus;

automatically identifying the apparatus as malperforming if the number exceeds a control limit;

characterized in that the method comprises:

defining classes of defect types in terms of visible appearance and defining for each class a respective control limit;

maintaining an association associating classes with apparatus types used in processing steps;

performing the processing steps on a wafer;

determining respective numbers of defects of different classes on the wafer after performing said processing steps;

comparing the respective number for each class to the control limit for that class, if the respective number of defects of a particular class exceeds the control limit for that particular class, automatically using the association to find the particular processing step and particular apparatus type associated with that particular class, and bringing a particular apparatus off-line that is of said particular apparatus type and has been used in that particular processing step.

2. A method according to claim 1, wherein said determining step is performed at a first stage during processing of the wafer, the method comprising detecting locations of further defects on the wafer at a second stage, at least one of said processing steps following the second stage and preceding the first stage, said determining of the respective numbers comprising counting visible defects at the first stage, only such visible defects being counted which do not lie at a location on the wafer where further defects have been detected at the second stage.

3. A method according to claim 1, wherein said determining step is performed at a first stage during processing of the wafer, the method comprising counting a count of visible defects at the first stage, further determining a further number of defects on the wafer at a second stage, said processing steps following the second stage and preceding the first stage, the number of defects being determined by subtracting from the count of defects an estimated prior number of defects derived from said further number.

4. A method according to claim 1, wherein the defects of at least one class are clustered into spatially localized clusters of defects, said respective number of defects in said at least one class being at most counts of clusters, rather than counts of individual defects.

5. A method according to claim 1, wherein said counting is performed only for a sub-area or sub-areas of the wafer.

6. A method according to claim 1, comprising detecting defects by detecting deviations between patterns on the wafer to reference patterns, the detected defects being subsequently classified according to visual appearance.

7. A method according to claim 1, wherein at least said defining, maintaining, counting, comparing and witching off-line steps are performed automatically using a factory control computer system.

* * * * *